(12) United States Patent
Chung et al.

(10) Patent No.: US 8,450,672 B2
(45) Date of Patent: May 28, 2013

(54) CMOS IMAGE SENSORS FORMED OF LOGIC BIPOLAR TRANSISTORS

(75) Inventors: Shine Chung, San Jose, CA (US);
Tao-Wen Chung, Zhubei (TW);
Fu-Lung Hsueh, Cranbury, NJ (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 387 days.

(21) Appl. No.: 12/751,552

(22) Filed: Mar. 31, 2010

(65) Prior Publication Data

US 2010/0327148 A1 Dec. 30, 2010

Related U.S. Application Data

(60) Provisional application No. 61/221,959, filed on Jun. 30, 2009.

(51) Int. Cl.
*H01L 27/146* (2006.01)
*H01L 31/101* (2006.01)

(52) U.S. Cl.
USPC .............. 250/208.1; 250/214.1; 257/291; 257/462

(58) Field of Classification Search
USPC .............. 250/208.1, 214.1; 257/290–292, 257/461, 462
See application file for complete search history.

(56) References Cited

U.S. PATENT DOCUMENTS

| 3,946,151 | A | * | 3/1976 | Kamiyama et al. ........... 348/241 |
| 4,016,594 | A | | 4/1977 | Shappir |
| 4,120,707 | A | | 10/1978 | Beasom |
| 5,376,816 | A | | 12/1994 | Nishigoori et al. |
| 5,416,031 | A | | 5/1995 | Miwa |
| 5,440,164 | A | | 8/1995 | Finney et al. |
| 5,581,103 | A | | 12/1996 | Mizukami |
| 5,614,424 | A | | 3/1997 | Wong et al. |
| 5,631,483 | A | | 5/1997 | Ferla et al. |
| 5,648,279 | A | | 7/1997 | Imai |
| 5,666,001 | A | | 9/1997 | Miwa |
| 5,717,241 | A | | 2/1998 | Malhi et al. |
| 6,124,618 | A | | 9/2000 | Wong et al. |
| 6,137,146 | A | | 10/2000 | Manning |
| 6,249,031 | B1 | | 6/2001 | Verma et al. |
| 6,399,990 | B1 | | 6/2002 | Brennan et al. |

(Continued)

FOREIGN PATENT DOCUMENTS

| JP | 2-294063 | 12/1990 |
| JP | 04-018763 | 1/1992 |

(Continued)

OTHER PUBLICATIONS

Au, K. K., et al., "Field-Plated High Gain Lateral Bipolar Transistor in Standard CMOS Process for BiNMOS Application," IEEE Custom Integrated Circuits Conference, 1991, 4 pages.

(Continued)

*Primary Examiner* — Kevin Pyo
(74) *Attorney, Agent, or Firm* — Slater & Matsil, L.L.P.

(57) ABSTRACT

An integrated circuit structure includes an image sensor cell, which further includes a photo transistor configured to sense light and to generate a current from the light.

19 Claims, 5 Drawing Sheets

U.S. PATENT DOCUMENTS

| | | | |
|---|---|---|---|
| 6,429,491 | B1 | 8/2002 | Schnaitter |
| 6,455,902 | B1 | 9/2002 | Voldman |
| 7,620,143 | B2 * | 11/2009 | Ikhlef et al. .................... 378/19 |
| 7,723,803 | B2 | 5/2010 | Chung |
| 2003/0197226 | A1 | 10/2003 | Chen et al. |
| 2004/0256678 | A1 | 12/2004 | Goshima et al. |
| 2008/0099806 | A1 * | 5/2008 | Kang et al. .................... 257/292 |
| 2010/0032766 | A1 | 2/2010 | Chen et al. |
| 2010/0187637 | A1 | 7/2010 | Chung |

FOREIGN PATENT DOCUMENTS

| | | |
|---|---|---|
| JP | 4-225238 | 8/1992 |
| JP | 6-120431 | 4/1994 |
| JP | 9-213708 | 8/1997 |

OTHER PUBLICATIONS

Tamba, A., et al., "CMOS-Compatible Lateral Bipolar Transistor for BiCMOS Technology: Part II—Experimental Results," IEEE Transactions on Electron Devices, vol. 39, No. 8, Aug. 1992, pp. 1865-1869.

Verdonckt-Vandebroek, S., et al., "High-Gain Lateral Bipolar Action in a MOSFET Structure," IEEE Transactions on Electron Devices, vol. 38, No. 11, Nov. 1991, pp. 2487-2496.

Office Action issued by Chinese Patent Office on Nov. 23, 2007 for Application No. 2006100568424, 10 pages.

Office Action issued by Japanese Patent Office with translation on Feb. 22, 2010 for Application No. 2006-061515, 5 pages.

* cited by examiner

CMOS IMAGE SENSORS FORMED OF LOGIC BIPOLAR TRANSISTORS

This application claims the benefit of U.S. Provisional Application No. 61/221,959 filed on Jun. 30, 2009, entitled "CMOS Image Sensors Formed of Logic Bipolar Transistors," which application is hereby incorporated herein by reference.

CROSS-REFERENCE TO RELATED APPLICATION

This application relates to the following commonly-assigned U.S. patent application Ser. No. 11/075,141, filed Mar. 7, 2005, and entitled "Bipolar Device Compatible with CMOS Process Technology," which application is hereby incorporated herein by reference.

TECHNICAL FIELD

This invention relates generally to image sensors, and more particularly to image sensors formed of logic bipolar transistors.

BACKGROUND

Active-pixel image sensors are widely used in image devices, such as cameras, video recorders, and the like. Conventionally, active-pixel sensors are formed of charge-coupled devices (CCDs). As an alternative, active-pixel sensors may also be formed of photo diodes using complementary metal-oxide-semiconductor (CMOS) processes.

FIG. 1 illustrates a commonly known integrated active-pixel sensor, which includes an array of cells. FIG. 2 illustrates one of the cells in the array. The cell includes reset transistor M1, source follower M2, and select-gate transistor M3. Photo diode PD is coupled to the gate of source follower M2 and the source of reset transistor M1.

The operation of the cell is discussed as follows. First, a logic high signal is applied to the gate of reset transistor M1, so that photo diode PD is reverse-biased by power supply voltage VDD. A cross-sectional view of photo diode PD is schematically illustrated in FIG. 2, wherein photo diode PD includes an n+ region in contact with a p-substrate. Under the reverse bias by power supply voltage VDD, depletion region DR is generated. Accordingly, photo diode PD acts as a capacitor that is charged by power supply voltage VDD. Node NA is thus charged to a high voltage. Transistor M1 is then turned off and the charges are stored at node NA.

During the operation of photo diode PD, it may or may not be exposed to light. If photo diode PD is exposed to light, electron-hole pairs are generated in depletion region DR, and hence the charges stored at node NA are discharged to the ground by a current flowing through photo diode PD. Accordingly, the voltage at node NA is brought down. If, however, photo diode PD is not exposed to light, no electron-hole pairs are generated in depletion region DR, and the charges stored at node NA remain. Accordingly, the voltage at node NA is at least higher than if photo diode PD is exposed to the light. Such a voltage difference may be used to determine whether the respective cell is exposed to light.

The charges at node NA affect the operation of source follower M2, which acts as an amplifier amplifying the state at node NA without draining the charges at node NA. If photo diode PD is exposed to light, the voltage at node NB will be lower, otherwise, it will be higher. When line RS' is set to logic high, select-gate transistor M3 is turned on to connect node NB to a column line. Accordingly, the voltage at the column line reflects whether photo diode PD is exposed to light or not.

The sensor array as shown in FIG. 1 suffers from drawbacks. The sensitivity of photo diode PD dominates the performance of the sensor array. However, the designers of the image sensor array face a dilemma. If the area of photo diode PD is smaller, the sensitivity of photo diode PD will be low. Conversely, if the area of photo diode PD is increased to improve the sensitivity, the response time of the sensor array will be sacrificed, and the resolution of the sensor array will be low.

SUMMARY OF THE INVENTION

In accordance with one aspect of the present invention, an integrated circuit structure includes an image sensor cell, which further includes a photo transistor configured to sense light and to generate a current from the light. Other embodiments are also disclosed.

Depending on the embodiments, the advantageous features of the present invention include improved sensitivity of the image sensor array. Accordingly, the area of each of the image sensor cells may be reduced, and the resolution of the image sensor array may be increased.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention and do not limit the scope of the invention.

A novel CMOS image sensor and the method of forming the same are presented. The variations and the operation of the embodiment are then discussed. Throughout the various views and illustrative embodiments of the present invention, like reference numbers are used to designate like elements.

Figure 1:
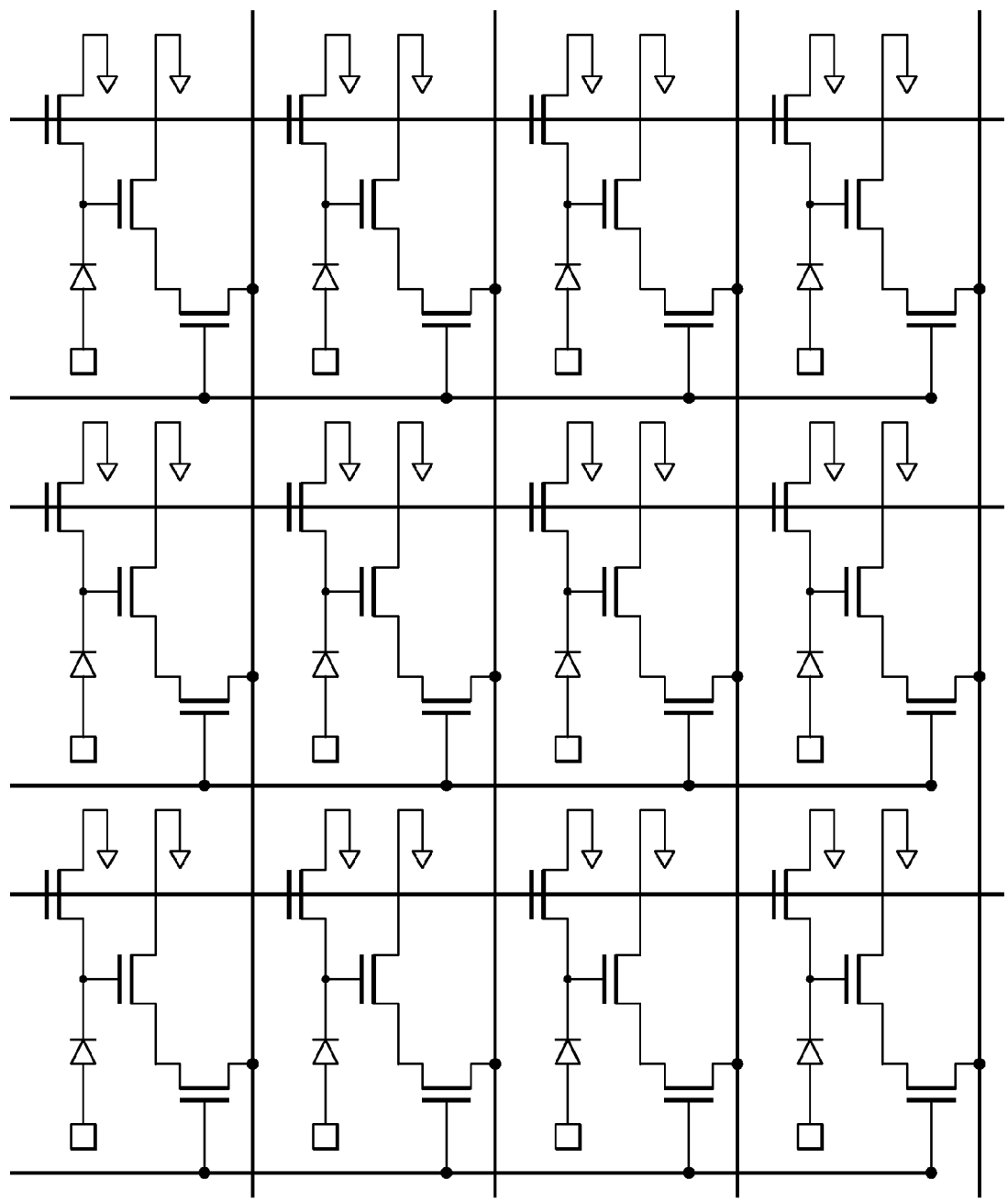
FIG. 1 illustrates a conventional image sensor array.
Figure 2:
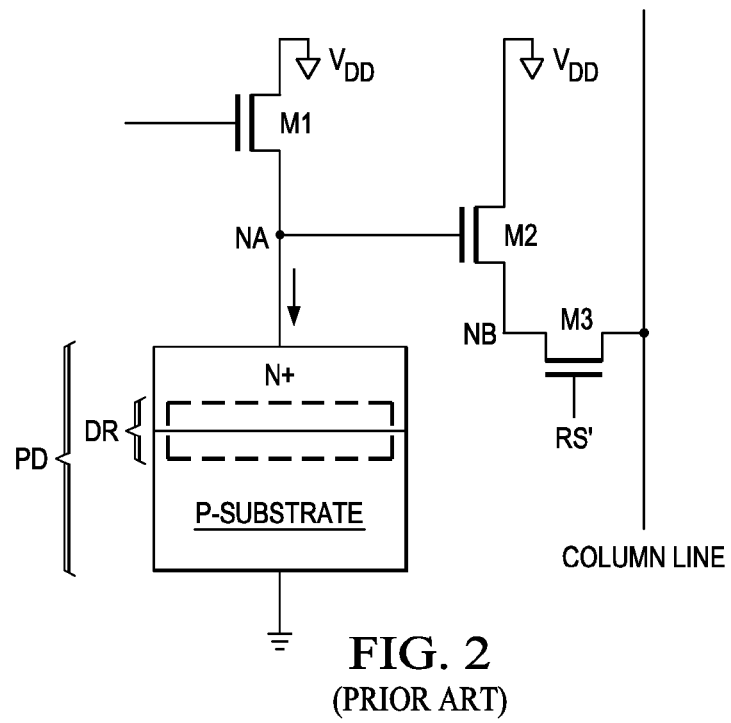
FIG. 2 illustrates an image sensor cell comprising a photo diode as a light-sensing device.
Figure 3:
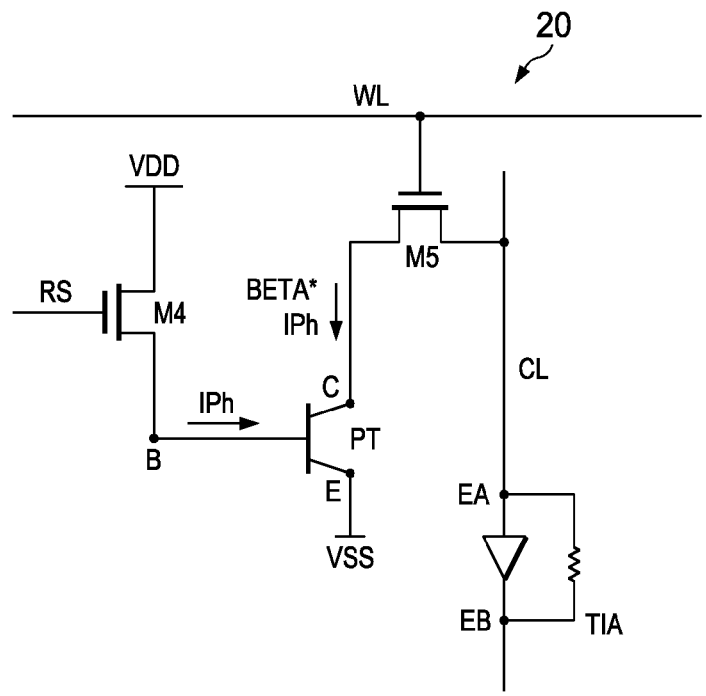
FIG. 3 illustrates an image sensor cell comprising a photo transistor.

FIG. 3 illustrates image sensor cell 20. Image sensor cell 20 includes logic bipolar transistor PT (also referred to as photo transistor PT hereinafter), which further includes base B, collector C, and emitter E. Logic bipolar transistor PT acts as a photo transistor that behaves differently when exposed or not exposed to light. In an embodiment, photo transistor PT is an NPN bipolar transistor. In other embodiments, photo transistor PT is a PNP bipolar transistor. In the following discussion, an NPN photo transistor PT is used as an example to explain the concept of the embodiments. Image sensor cell 20 further includes reset transistor M4 and selector M5 (also referred to as a select transistor). The gate of reset transistor M4 is controlled by a reset signal at node RS. The gate of selector M5 is connected to word line WL, which determines whether the collector current of photo transistor PT can flow to column line CL or not.

Figure 4:
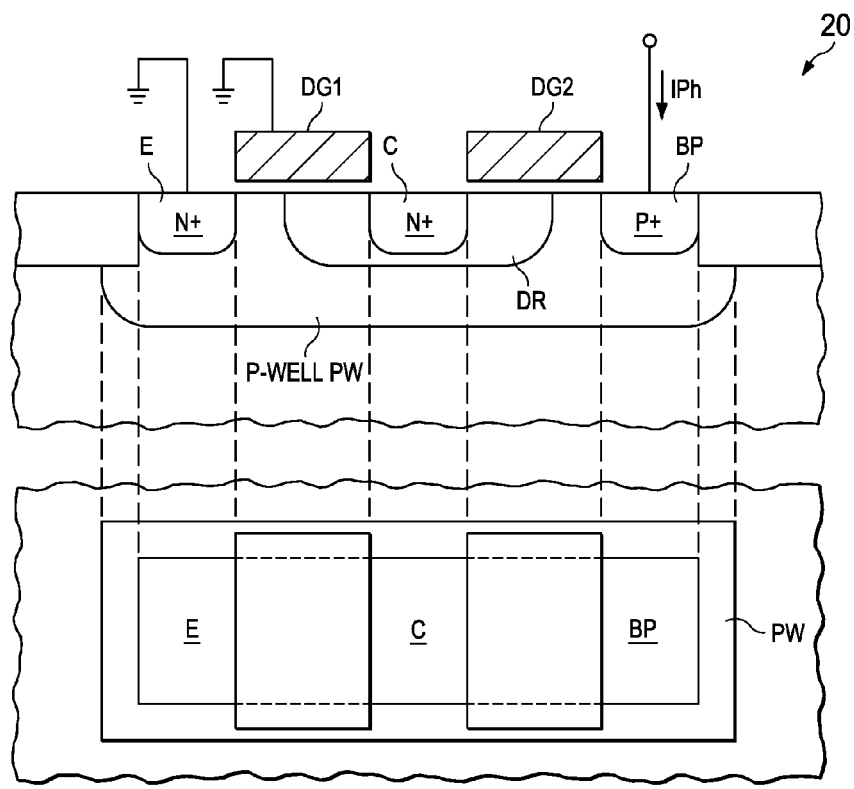
FIG. 4 illustrates a cross-sectional view and a top view of a photo transistor.

FIG. 4 illustrates a cross-sectional view and a layout of an exemplary photo transistor PT, wherein the top portion of FIG. 4 is the cross-sectional view, while the bottom portion is the layout. Base B as shown in FIG. 3 includes P-well region PW and base contact (pickup region) BP, which is heavily doped to P type, and hence is also referred to as a P+ region. Collector C and emitter E are heavily doped to N type, and hence are also referred to as N+ regions. Base contact BP, collector C and emitter E may be laterally spaced apart from each other by P-well region PW, which may be achieved by the formation of dummy gates DG1 and DG2. Further, in various embodiments, none of the base contact BP, collector C and emitter E are interconnected, so that photo transistor PT will not be used as a photo diode. Accordingly, photo transistor PT may perform the function of amplifying current Iph, as will be discussed in detail in subsequent paragraphs. Dummy gates DG1 and DG2 mask the underlying P-well region PW during the implant steps of base contact BP, collector C and emitter E. Alternatively, a resist protective oxide (RPO) (not shown in FIG. 4) may be formed to replace dummy gates DG1 and DG2 and separate base contact BP, collector C and emitter E. To allow a logic bipolar transistor to act as a photo transistor, base contact BP, collector C and emitter E are in the same active region (P-well region PW in this embodiment). In an embodiment, P-well region PW, base contact BP, collector C and emitter E are formed by sharing process steps and masks for forming complementary metal-oxide-semiconductor (CMOS) devices, and may be formed simultaneously with the components of other CMOS devices in the same chip, such as transistors M4, M5, and the devices in trans-impedance amplifier TIA as shown in FIG. 3. Dummy gate DG1 and/or emitter E may be grounded.

Photo transistor PT as shown in FIG. 3 has the function of amplifying the base current. Assuming the current flowing through base B is Iph, and the current gain of photo transistor PT is Beta, the collector current flowing through collector C is then Beta*Iph, which is significantly greater than base current Iph (refer to FIG. 4). When exposed to light, current Iph is the excited photo current caused by the electron-hole pair as a result of the excited depletion region DR as shown in FIG. 4. Accordingly, base current Iph is relative low, and the amplification of current Iph significantly improves the sensitivity of the resulting image sensor cell 20 as shown in FIG. 3. During the operation of photo transistor PT, dummy gate DG1 and emitter E (FIG. 4) may be connected to power supply voltage VSS, which may be the electrical ground.

Figure 5:
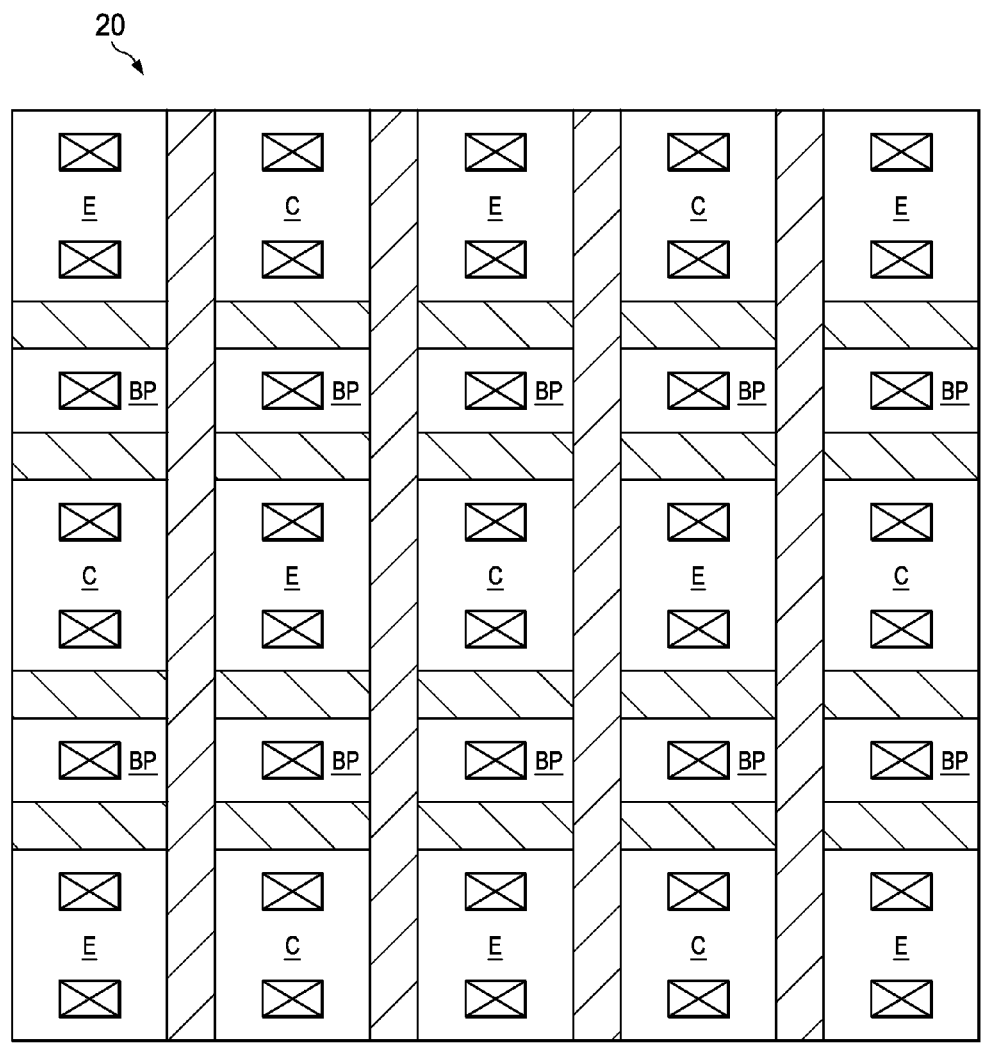
FIG. 5 illustrates a layout scheme of a photo transistor.

To maximize the sensitivity of image sensor cell 20 as shown in FIG. 3, the layout of photo transistor PT may take various forms, as are provided in the co-pending commonly-assigned U.S. patent application Ser. No. 11/075,141, filed Mar. 7, 2005, and entitled "Bipolar Device Compatible with CMOS Process Technology," which is hereby incorporated herein by reference, in which the disclosed logic bipolar transistors may be used as photo transistor PT. For example, FIG. 5 illustrates an exemplary layout of photo transistor PT, wherein all base contacts BP may be interconnected, all emitters E may be interconnected, and all collectors C may be interconnected. The formation details and advantageous features of the layout as shown in FIG. 5 are not discussed herein.

In the operation of image sensor cell 20 as shown in FIG. 3, light (photons) is projected onto image sensor cell 20. After the light is stable (assuming image sensor cell 20 receives light in this operation), reset node RS is turned to logic high, so that power supply voltage VDD is provided to base B of photo transistor PT. Photo transistor PT will thus be reset and will be ready to sense light. Next, word line WL is set to logic high, so that photo transistor PT starts amplifying the base current Iph to generate collector current Beta*Iph, which flows to column line CL. Trans-impedance amplifier TIA is used to further convert collector current Beta*Iph to a voltage. Trans-impedance amplifier TIA has one end (EA) for receiving the collector current, and the output voltage is applied at output end EB.

If, however, no light is projected onto photo transistor PT, current Iph, if any, will be significantly smaller than if the light is projected onto photo transistor PT. As a result, collector current Beta*Iph will also be much smaller, which in turn results in a significantly lower voltage at output end EB of trans-impedance amplifier TIA.

Figure 6:
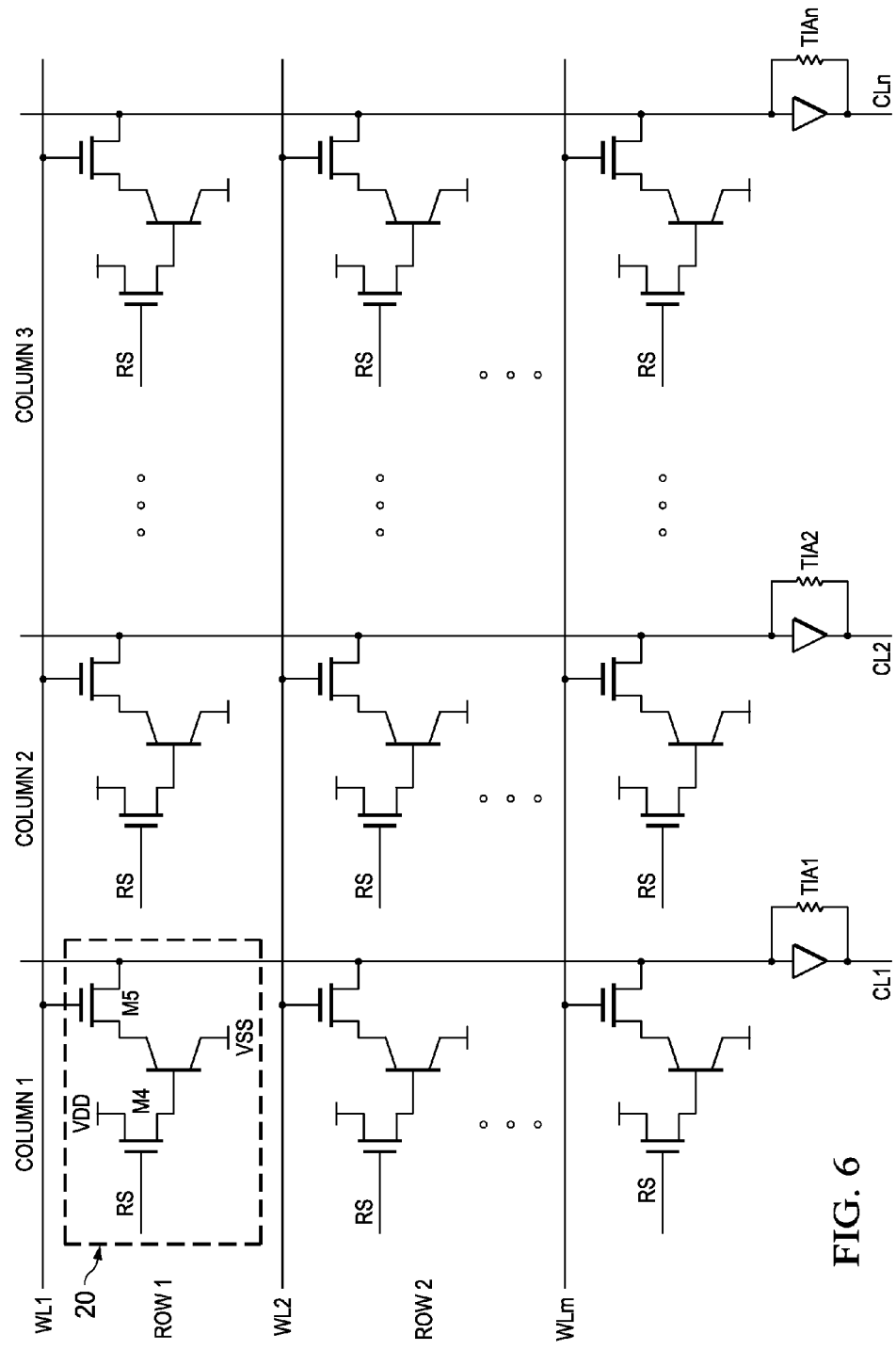
FIG. 6 illustrates an image sensor array, wherein each of the cells in the image sensor array includes a photo transistor.

FIG. 6 illustrates an image sensor array, which includes a plurality of image sensor cells 20 arranged as rows and columns. For a clear view, only one image sensor cell 20 is marked. A plurality of word lines WL (denoted as WL1, WL2 ... WLm) and a plurality of column lines CL (denoted as CL1, CL2 ... CLn) are connected to the image sensor array. In an embodiment, reset nodes RS of all image sensor cells 20 in the image sensor array are connected together to receive a same reset signal. In alternative embodiments, reset nodes RS of all image sensor cells 20 in a same row of the image sensor array are connected together to receive a same reset signal, while reset nodes RS of the image sensor cells 20 in different rows are disconnected from each other.

Figure 7:
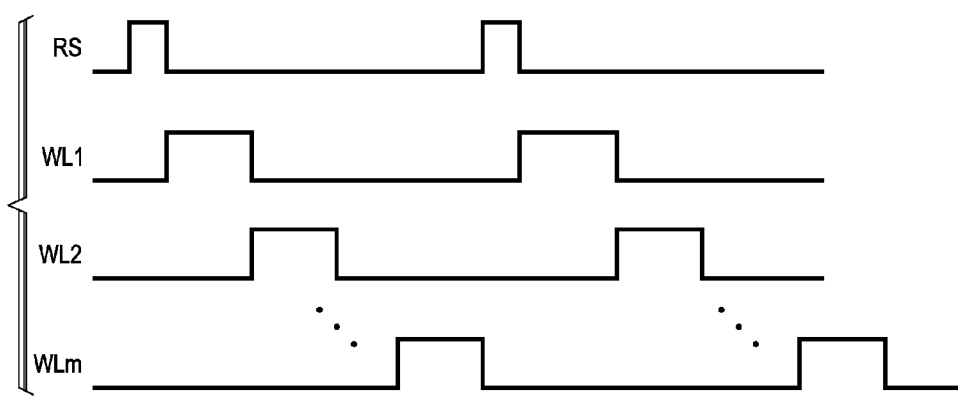
FIG. 7 illustrates a sequence diagram in the operation of the image sensor array as shown in FIG. 6.

In an embodiment, image sensor cells 20 may sense light row by row. FIG. 7 illustrates an exemplary sequence diagram of the signals involved in the operation of the image sensor array. First, reset signal at all nodes RS (refer to FIG. 6) is set to high, so that all of photo transistors PD in the image sensor array are reset. In an embodiment, as shown in FIG. 7, the reset signal at node RS is set back to logic low before word lines WL are turned on. First, a word line connected to one of the rows, for example, word line WL1, is turned on, so that the collector currents of photo transistors PT in row 1 flow to the respective column lines CL, and are converted to voltages by the respective trans-impedance amplifiers TIA1, TIA2 ... TIAn (refer to FIG. 6). Assuming image sensor cell 20 in column 1 (and row 1) receives light, while image sensor cell 20 in column 2 (and row 1) receives no light (or light with a lower intensity), the collector current flowing to column line CL2 will be smaller than the collector current flowing to column CL1, and may be converted to a lower voltage by trans-impedance amplifier TIA2 than the voltage generated by trans-impedance amplifier TIA1. As a result, the light intensities sensed by all of image sensor cells 20 in row 1 are converted to voltages. Word line WL1 is then turned off to conclude the light-sensing by row 1 of the image sensor array.

Next, as shown in FIG. 7, a second word line, for example, word line WL2 is turned on, so that image sensor cells 20 in row 2 start sensing light. The light-sensing and the current-to-voltage conversion are essentially the same as performed by row 1 of the image sensor array, and hence are not repeated herein. Next, word line WL2 is turned off, followed by the turning on-and-off of word line WL3 (not shown). By turning word lines WL on-and-off one by one, all of the image sensor cells in the entire image sensor array finish sensing the light.

Although in the embodiments provided in the preceding paragraphs, NPN photo transistors are discussed, one skilled in the art will realize that PNP phototransistors may also be used. It is realized, however, that the current gain Beta of PNP photo transistors may be lower than that of NPN photo transistors.

The embodiments of the present invention have several advantageous features. By using photo transistors instead of photo diodes as light-sensing devices, the sensitivity of the image sensor array may be improved. Accordingly, the area of each of the image sensor cells may be reduced. This means that the resolution of the image sensor array may be further improved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit structure comprising:
   an image sensor cell comprising:
   a photo transistor configured to sense light and to generate a current from the light;
   a column line;
   a word line; and
   a selector transistor, wherein a source of the selector transistor is connected, free of intervening active devices, to a collector of the phototransistor, wherein a drain of the selector transistor is connected to the column line, and wherein a gate of the selector transistor is connected to the word line.

2. The integrated circuit structure of claim 1 further comprising a trans-impedance amplifier comprising an input connected to the column line.

3. The integrated circuit structure of claim 1 further comprising:
   a reset transistor comprising a source-to-drain path coupled between a base of the phototransistor and a positive power supply node; and
   a reset node connected to a gate of the reset transistor, the reset node separate from the word line.

4. The integrated circuit structure of claim 1, wherein the photo transistor comprises:
   a well region of a first conductivity type;
   a base contact of the first conductivity type in the well region;
   a collector of a second conductivity type opposite to the first conductivity type in the well region; and
   an emitter of the second conductivity type in the well region, wherein the base contact, the collector, and the emitter are laterally spaced apart from each other by the well region.

5. The integrated circuit structure of claim 4 further comprising:
   a first dummy gate between and laterally separating the base contact from the collector; and
   a second dummy gate between and laterally separating the emitter from the collector.

6. The integrated circuit structure of claim 5, wherein the second dummy gate is grounded.

7. The integrated circuit structure of claim 4, wherein the first conductivity type is p type, and the second conductivity type is n type.

8. The integrated circuit structure of claim 4, wherein the first conductivity type is n type, and the second conductivity type is p type.

9. An integrated circuit structure comprising:
   a positive power supply node; and
   an image sensor cell comprising:
   a photo transistor comprising a base, a collector, and an emitter;
   a selector transistor comprising a source-to-drain path, wherein the source-to-drain path has a first end coupled, without intervening active devices, to the collector of the photo transistor; and
   a reset transistor comprising a source-to-drain path coupled between the base of the photo transistor and the positive power supply node.

10. The integrated circuit structure of claim 9 further comprising:
    a column line coupled to a second end of the source-to-drain path of the selector transistor; and
    a word line coupled to the gate of the selector transistor.

11. The integrated circuit structure of claim 10 further comprising a trans-impedance amplifier comprising an input connected to the column line.

12. The integrated circuit structure of claim 9, wherein the photo transistor comprises:
    a well region of a first conductivity type;
    a base contact of the first conductivity type in the well region;
    a collector of a second conductivity type in the well region; and
    an emitter of the second conductivity type opposite the first conductivity type in the well region, wherein the base contact, the collector, and the emitter are laterally spaced apart from each other by the well region.

13. The integrated circuit structure of claim 12 further comprising:
    a first dummy gate between and laterally spacing the base contact from the collector; and
    a second dummy gate between and laterally spacing the emitter from the collector.

14. An integrated circuit structure comprising:
    a first power supply node carrying a first power supply voltage;
    a second power supply node carrying a second power supply voltage lower than the first power supply voltage;
    an array of image sensor cells arranged as rows and columns, wherein each of the image sensor cells comprises:
    a photo transistor coupled to the first power supply node, and wherein the photo transistor comprises a collector, and further comprises an emitter connected to the second power supply node; and a selector transistor, wherein a source of the selector transistor is connected to the collector without intervening active devices;

a plurality of word lines, wherein each of the rows of the image sensor cells is connected to one of the plurality of word lines; and a plurality of column lines, wherein each of the columns of the image sensor cells is connected to one of the plurality of column lines, the selector transistor of each image sensor cell providing a source-to-drain current path between the phototransistor and one of the plurality of column lines.

15. The integrated circuit structure of claim 14 further comprising a plurality of trans-impedance amplifiers, with each of the plurality of trans-impedance amplifiers comprising an input connected to one of the plurality of column lines.

16. The integrated circuit structure of claim 14, wherein each of the image sensor cells further comprises:
a reset transistor coupled between a base of the photo transistor and a positive power supply node.

17. The integrated circuit structure of claim 16, wherein gates of reset transistors of all of the image sensor cells in the array are connected to a common reset node.

18. The integrated circuit structure of claim 9, wherein the photo transistor comprises a collector connected to the selector, and an emitter connected to a VSS node.

19. The integrated circuit structure of claim 14, wherein the first power supply node is a VDD node, and the second power supply node is a VSS node.

* * * * *